(12) United States Patent
Okumura et al.

(10) Patent No.: US 12,542,230 B2
(45) Date of Patent: Feb. 3, 2026

(54) COIL COMPONENT AND CIRCUIT BOARD HAVING THE SAME

(71) Applicant: TDK Corporation, Tokyo (JP)

(72) Inventors: Takeshi Okumura, Tokyo (JP); Kouji Kawamura, Tokyo (JP); Hidenori Tsutsui, Tokyo (JP); Hibiki Miyasaka, Tokyo (JP); Yosuke Mizutani, Tokyo (JP)

(73) Assignee: TDK CORPORATION, Tokyo (JP)

( * ) Notice: Subject to any disclaimer, the term of this patent is extended or adjusted under 35 U.S.C. 154(b) by 212 days.

(21) Appl. No.: 18/409,624

(22) Filed: Jan. 10, 2024

(65) Prior Publication Data

US 2024/0242872 A1 Jul. 18, 2024

(30) Foreign Application Priority Data

Jan. 17, 2023 (JP) ................ 2023-004901

(51) Int. Cl.
| | |
|---|---|
| *H01F 27/28* | (2006.01) |
| *H01F 27/29* | (2006.01) |
| *H01F 27/34* | (2006.01) |
| *H05K 1/18* | (2006.01) |

(52) U.S. Cl.
CPC ....... *H01F 27/2804* (2013.01); *H01F 27/292* (2013.01); *H05K 1/181* (2013.01); *H01F 2027/2809* (2013.01); *H05K 2201/1003* (2013.01)

(58) Field of Classification Search
CPC ................ H01F 27/34; H01F 27/2804; H05K 2201/1003
See application file for complete search history.

(56) References Cited

U.S. PATENT DOCUMENTS

| | | | |
|---|---|---|---|
| 2011/0291790 A1* | 12/2011 | Okumura ............ | H01F 17/0013 336/200 |
| 2016/0247630 A1 | 8/2016 | Kido et al. | |
| 2017/0150605 A1* | 5/2017 | Nagai .................... | H05K 1/111 |
| 2017/0316873 A1* | 11/2017 | Igarashi .............. | H01F 27/2828 |
| 2018/0068780 A1* | 3/2018 | Shimoda ............. | H01F 17/0013 |
| 2019/0066900 A1* | 2/2019 | Nakajima ............. | H01F 41/041 |

FOREIGN PATENT DOCUMENTS

WO 2013/031880 A1 3/2013

* cited by examiner

*Primary Examiner* — Sherman Ng
(74) *Attorney, Agent, or Firm* — RIMON P.C.

(57) ABSTRACT

Disclosed herein is a coil component that includes an element body having a mounting surface, a coil pattern embedded in the element body and having a coil axis extending perpendicular to the mounting surface, and a terminal electrode connected to the coil pattern and exposed to the mounting surface. The terminal electrode has a cutout part so as to avoid overlapping with the coil pattern in a plan view along the coil axis.

4 Claims, 11 Drawing Sheets

COIL COMPONENT AND CIRCUIT BOARD HAVING THE SAME

CROSS-REFERENCE TO RELATED APPLICATION

This application claims the benefit of Japanese Patent Application No. 2023-004901, filed on Jan. 17, 2023, the entire disclosure of which is incorporated by reference herein.

BACKGROUND

Field of the Art

The present disclosure relates to a coil component and, more particularly, to a coil component having a mounting surface perpendicular to a coil axis direction. The present disclosure also relates to a circuit board on which such a coil component is mounted.

Description of Related Art

International Publication WO 2013/031880 discloses a coil component having a mounting surface perpendicular to a coil axis direction.

In coil components of such a type, when a terminal electrode and a coil pattern overlap each other in a coil axis direction, the stray capacitance of the coil pattern increases, which may deteriorate high-frequency characteristics. When the planar shape of the terminal electrode is simply reduced so as to avoid overlap between the terminal electrode and the coil pattern, the area of the terminal electrode may become insufficient.

SUMMARY

The present disclosure describes a technology related to a coil component having a mounting surface perpendicular to a coil axis direction, for reducing the stray capacitance of the coil pattern while sufficiently ensuring the area of the terminal electrode.

A coil component according to one aspect of the present disclosure includes: an element body having a mounting surface; a coil pattern embedded in the element body and having a coil axis extending perpendicular to the mounting surface; and a terminal electrode connected to the coil pattern and exposed to the mounting surface. The terminal electrode has a cutout part so as to avoid overlapping with the coil pattern in a plan view along the coil axis. With this configuration, it is possible to reduce the stray capacitance of the coil pattern while ensuring a sufficient exposed area of the terminal electrode on the mounting surface.

BRIEF DESCRIPTION OF THE DRAWINGS

The above features and advantages of the present disclosure will be more apparent from the following description of certain embodiments taken in conjunction with the accompanying drawings, in which.

DETAILED DESCRIPTION OF THE EMBODIMENTS

Some embodiments of the present disclosure will be explained below in detail with reference to the accompanying drawings.

Figure 1:
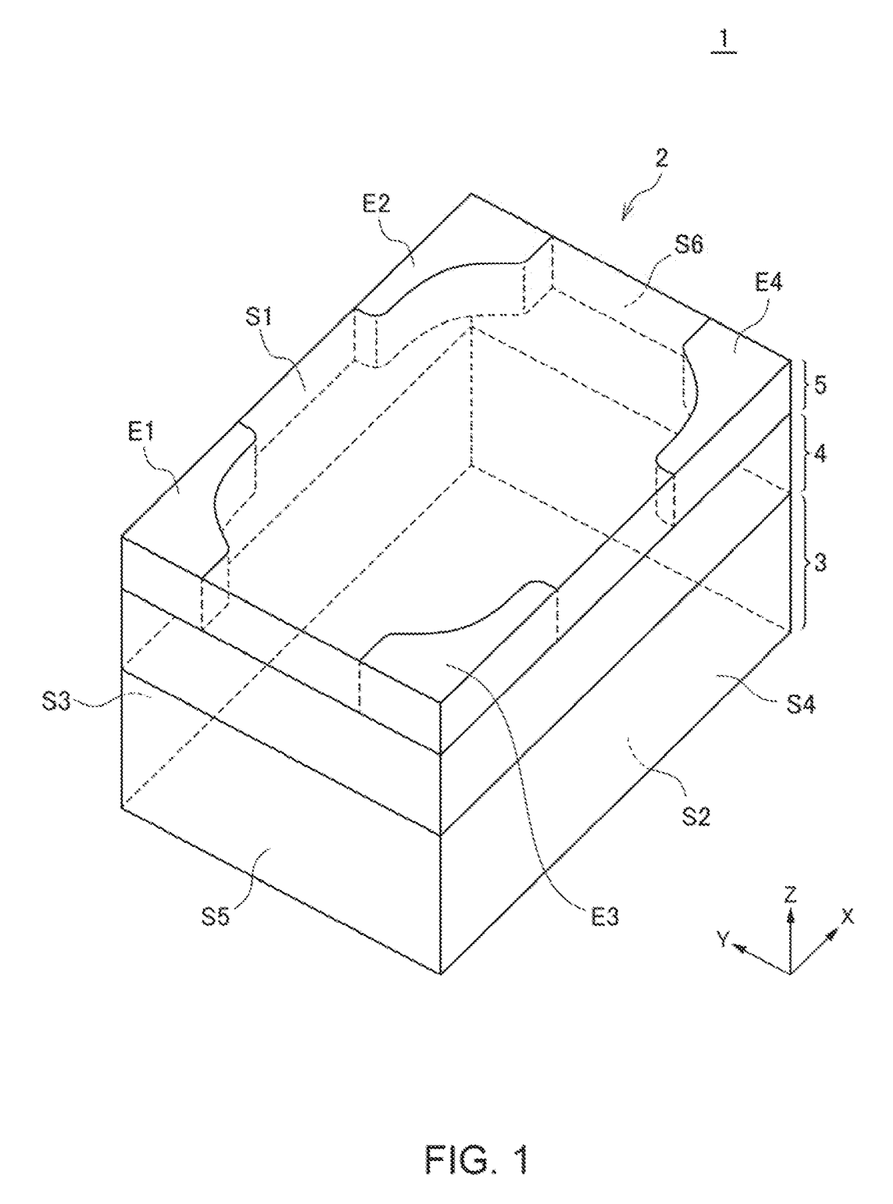
FIG. 1 is a schematic transparent perspective view illustrating the outer appearance of a coil component 1 according to an embodiment of the technology of the present disclosure.

FIG. 1 is a schematic transparent perspective view illustrating the outer appearance of a coil component 1 according to an embodiment of the technology of the present disclosure.

The coil component 1 according to the present embodiment is a surface-mount type common mode filter and has an element body 2 and four terminal electrodes E1 to E4 embedded in the element body 2, as illustrated in FIG. 1. The element body 2 includes a support 3 made of a high permeability material such as ferrite, a coil layer 4 stacked on the support 3, and a magnetic material layer 5 stacked on the coil layer 4. The coil layer 4 has a structure in which insulating layers and conductor layers are alternately stacked in the Z-direction, and each conductor layer has a coil pattern to be described later. The magnetic material layer 5 may be made of a composite magnetic material obtained by mixing ferrite or permalloy magnetic powder and resin. The terminal electrodes E1 to E4 are embedded in the magnetic material layer 5, and the surface of each of the terminal electrodes E1 to E4 is partly exposed from the element body 2.

The element body 2 has a substantially rectangular parallelepiped shape and has a mounting surface S1 and an upper surface S2 each constituting the XY plane and positioned on mutually opposite sides, side surfaces S3 and S4 each constituting the XZ plane and positioned on mutually opposite sides, and side surfaces S5 and S6 each constituting the YZ plane and positioned on mutually opposite sides. The mounting surface S1 and upper surface S2 are perpendicular to the Z-direction (stacking direction).

As illustrated in FIG. 1, the terminal electrode E1 is exposed to a corner portion formed by the mounting surface S1 and side surfaces S3 and S5. The terminal electrode E2 is exposed to a corner portion formed by the mounting surface S1 and side surfaces S3 and S6. The terminal electrode E3 is exposed to a corner portion formed by the mounting surface S1 and side surfaces S4 and S5. The terminal electrode E4 is exposed to a corner portion formed by the mounting surface S1 and side surfaces S4 and S6.

Figure 2:
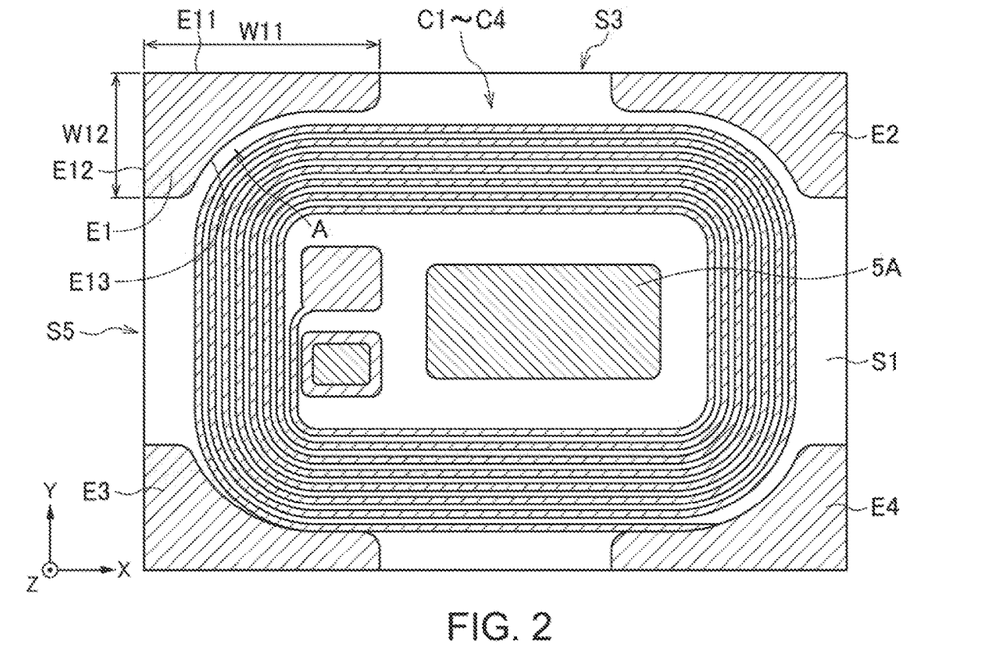
FIGS. 2 and 3 are schematic transparent perspective views of the coil component 1 as viewed in the Z-direction.

FIG. 2 is a schematic transparent perspective view of the coil component 1 according to the present embodiment as viewed in the Z-direction.

As illustrated in FIG. 2, coil patterns C1 to C4 are embedded in the coil layer 4 included in the element body 2. The coil axis direction of the coil patterns C1 to C4 is the Z-direction and is perpendicular to the mounting surface S1. In the present embodiment, the coil patterns C1 to C4 and terminal electrodes E1 to E4 do not overlap each other in a plan view (as viewed in the Z-direction), and the terminal electrodes E1 to E4 are each entirely disposed at a position overlapping the radially outer area of the coil patterns C1 to C4. Thus reduces a stray capacitance generated between the coil patterns C1 to C4 and the terminal electrodes E1 to E4.

A more detailed description will be made focusing on the terminal electrode E1. The terminal electrode E1 has an edge E11 extending along the boundary between the mounting surface S1 and the side surface S3, an edge E12 extending along the boundary between the mounting surface S1 and the side surface S5, and an edge E13 positioned on the mounting surface S1. A part of the edge E13 extends along the outermost turns of the coil patterns C1 to C4. The width of the edge E11 in the X-direction is W11, and the width of the edge E12 in the Y-direction is W12. As illustrated in FIG. 2, the coil patterns C1 to C4 exist at a position separated in the X-direction by a distance of width W11 from the side surface S5 and at a position separated in the Y-direction by a distance of width W12 from the side surface S3. Thus, when the terminal electrode E1 has a rectangular shape with a width of W11 in the X-direction and a width of W12 in the Y-direction, the terminal electrode E1 overlaps the coil patterns C1 to C4 in a plan view. In the present embodiment, the terminal electrode E1 has a cutout part A so as to prevent such overlap. Thus, the terminal electrode E1 does not have a rectangular shape but has a shape obtained by cutting out a part of a rectangular shape.

A part of the edge E13 constituting the cutout part A extends along the outermost turns of the coil patterns C1 to C4 in a plan view. Thus, the terminal electrode E1 has a portion whose X-direction width gradually decreases with increasing distance from the side surface S3 in the Y-direction and has a portion whose Y-direction width gradually decreases with increasing distance from the side surface S5 in the X-direction. The same applies to the other terminal electrodes E2 to E4.

Figure 3:
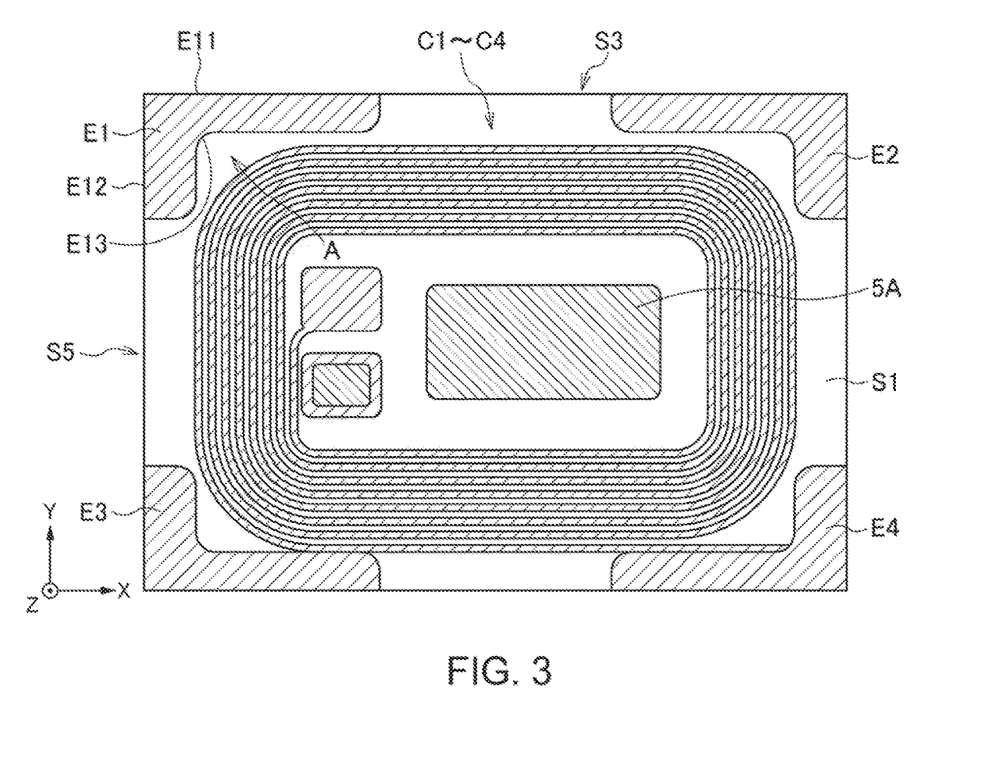

In the present embodiment, the terminal electrodes E1 to E4 have such a shape as cited above, so that a stray capacitance generated in the coil patterns C1 to C4 is reduced. In addition, as compared with a case where a part of each of the terminal electrodes E1 to E4 that is exposed to the mounting surface S1 has a planar shape of a simple rectangle, the exposed area of the terminal electrodes E1 to E4 can be increased. In the example illustrated in FIGS. 1 and 2, the edge E13 of the terminal electrode E1 extends along the outermost turns of the coil patterns C1 to C4; however, the present invention is not limited to this, but the planar shape of the terminal electrodes E1 to E4 may be an L-shape as in a modification illustrated in FIG. 3.

The following describes the configuration of each of the layers constituting the coil layer 4.

Figure 4:
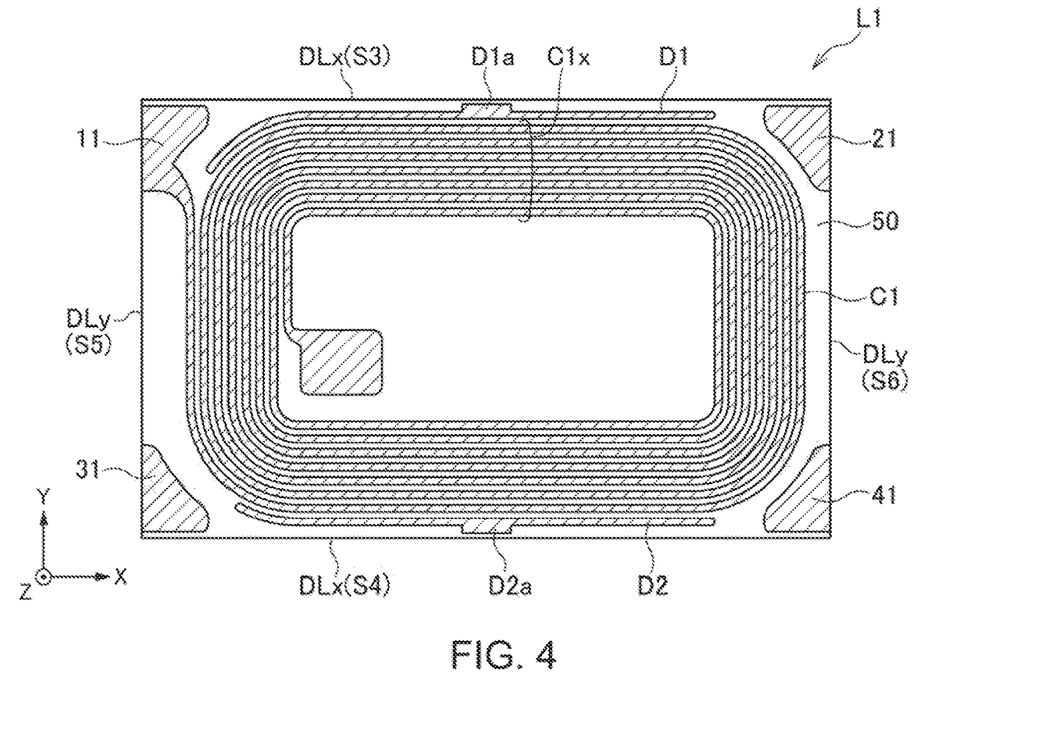
FIG. 4 is a schematic plan view for explaining the pattern shape of a conductor layer L1.

The coil layer 4 has a structure in which insulating layers 50, 60, 70, 80, and 90 and conductor layers L1 to L4 illustrated in FIGS. 4 to 11 are alternately stacked on the surface of the support 3. As illustrated in FIG. 4, the insulating layer 50 is a layer that covers the XY surface of the support 3, and the conductor layer L1 is formed on the surface thereof. The conductor layer L1 has a spirally-wound coil pattern C1, connection patterns 11, 21, 31, and 41, and dummy patterns D1 and D2. The outer peripheral end of the coil pattern C1 is connected to the connection pattern 11. The other connection patterns 21, 31, and 41 are not connected to the coil pattern C1 and are independent conductor patterns within the plane.

The dummy patterns D1 and D2 are also independent conductor patterns within the plane and are positioned at the outer periphery of the coil pattern C1. The dummy pattern D1 is disposed between the outermost turn of the coil pattern C1 and the side surface S3 and extends in the X-direction along the outermost turn of the coil pattern C1. The dummy pattern D2 is disposed between the outermost turn of the coil pattern C1 and the side surface S4 and extends in the X-direction along the outermost turn of the coil pattern C1. The side surfaces S3 and S4 are defined by a dicing line DLx. As illustrated in FIG. 4, the dummy patterns D1 and D2 have protruding parts D1a and D2a, respectively. The protruding part D1a protrudes toward the side surface S3 in the Y-direction from the main body of the dummy pattern D1. The protruding part D2a protrudes toward the side surface S4 in the Y-direction from the main body of the dummy pattern D2.

Figure 5:
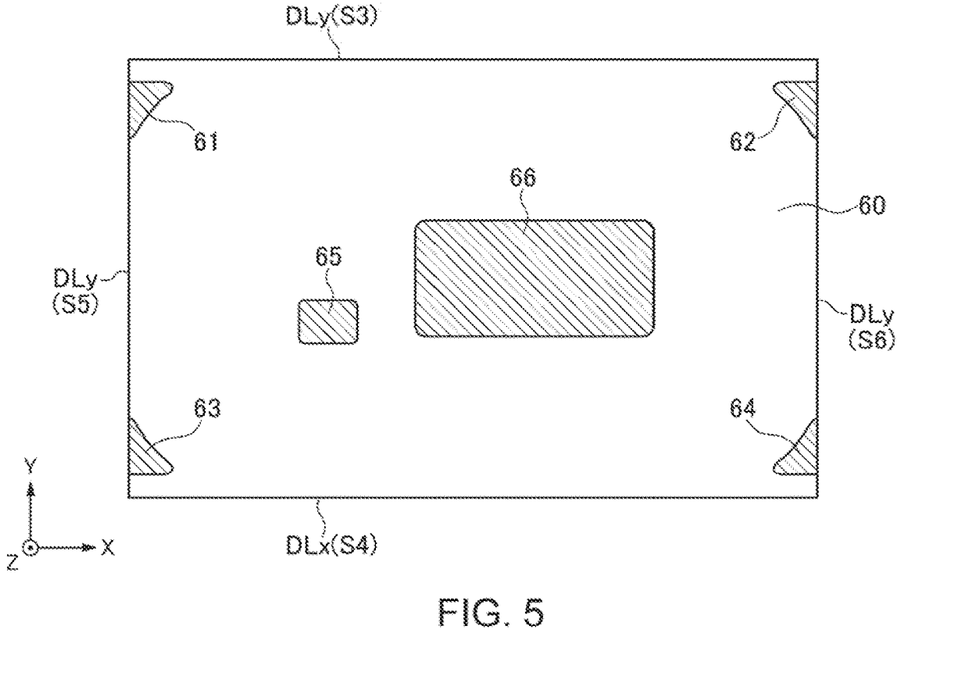
FIG. 5 is a schematic plan view for explaining the pattern shape of a insulating layer 60.

The conductor layer L1 is covered with the insulating layer 60 illustrated in FIG. 5. The insulating layer 60 has openings 61 to 66. The openings 61 to 64 are formed at positions overlapping the connection patterns 11, 21, 31, and 41, respectively. The opening 65 is formed at a position overlapping the inner peripheral end of the coil pattern C1. The opening 66 is formed at a position overlapping the inner diameter area surrounded by the coil pattern C1.

Figure 6:
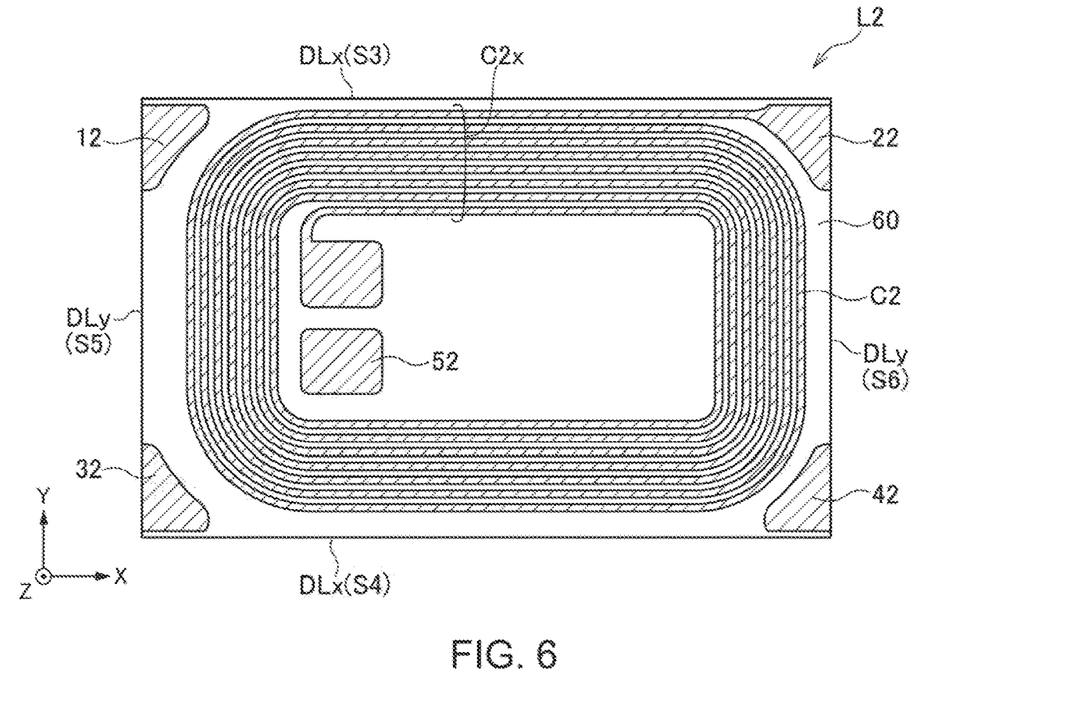
FIG. 6 is a schematic plan view for explaining the pattern shape of a conductor layer L2.

The conductor layer L2 illustrated in FIG. 6 is formed on the surface of the insulating layer 60. The conductor layer L2 has a spirally-wound coil pattern C2, connection patterns 12, 22, 32, and 42, and a relay pattern 52. The outer peripheral end of the coil pattern C2 is connected to the connection pattern 22. The other connection patterns 12, 32 and 42 and relay pattern 52 are not connected to the coil pattern C2 and are independent conductor patterns within the plane. The connection patterns 12, 22, 32, and 42 are connected respectively to the connection patterns 11, 21, 31, and 41 of the conductor layer L1 through the respective openings 61 to 64 formed in the insulating layer 60. The relay pattern 52 is connected to the inner peripheral end of the coil pattern C1 through the opening 65 formed in the insulating layer 60. The number of lines of the coil pattern C2 in a section $C2x$ extending in the X-direction is eight, while the number of lines of the coil pattern C1 in a section $C1x$ extending in the X-direction is seven, which may cause a level difference at the outermost turn in the section $C2x$. However, in the present embodiment, the dummy pattern D1 is disposed at a position overlapping the outermost turn in the section $C2x$, which makes such a level difference unlikely to occur.

Figure 7:
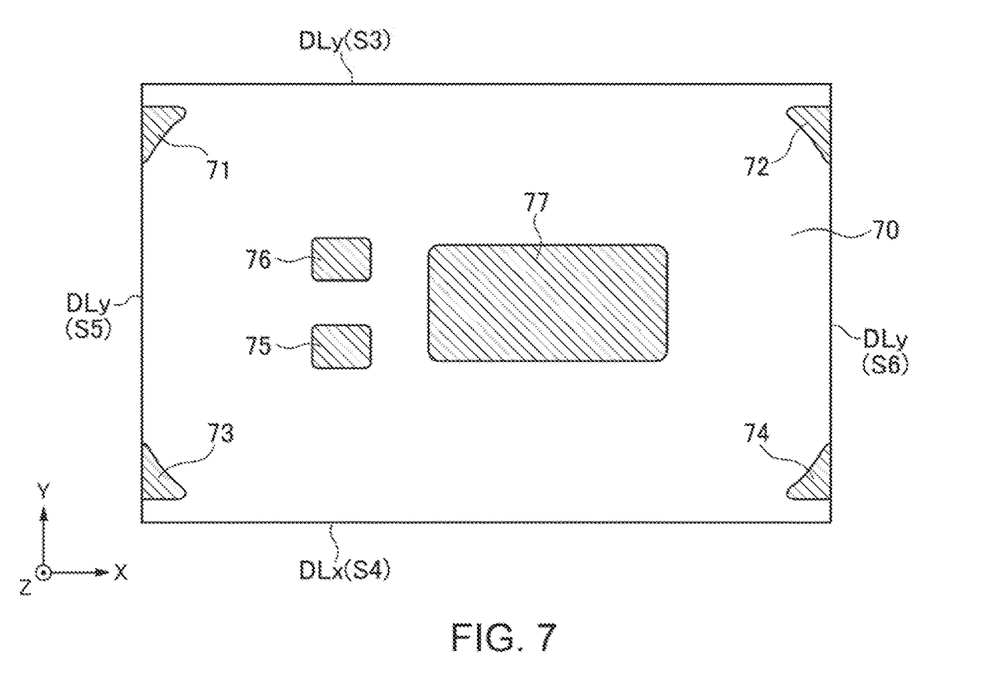
FIG. 7 is a schematic plan view for explaining the pattern shape of a insulating layer 70.

The conductor layer L2 is covered with the insulating layer 70 illustrated in FIG. 7. The insulating layer 70 has opening 71 to 77. The openings 71 to 74 are formed at positions overlapping the connection patterns 12, 22, 32, and 42, respectively. The opening 75 is formed at a position overlapping the relay pattern 52. The opening 76 is formed at a position overlapping the inner diameter end of the coil pattern C2. The opening 77 is formed at a position overlapping the opening 66.

Figure 8:
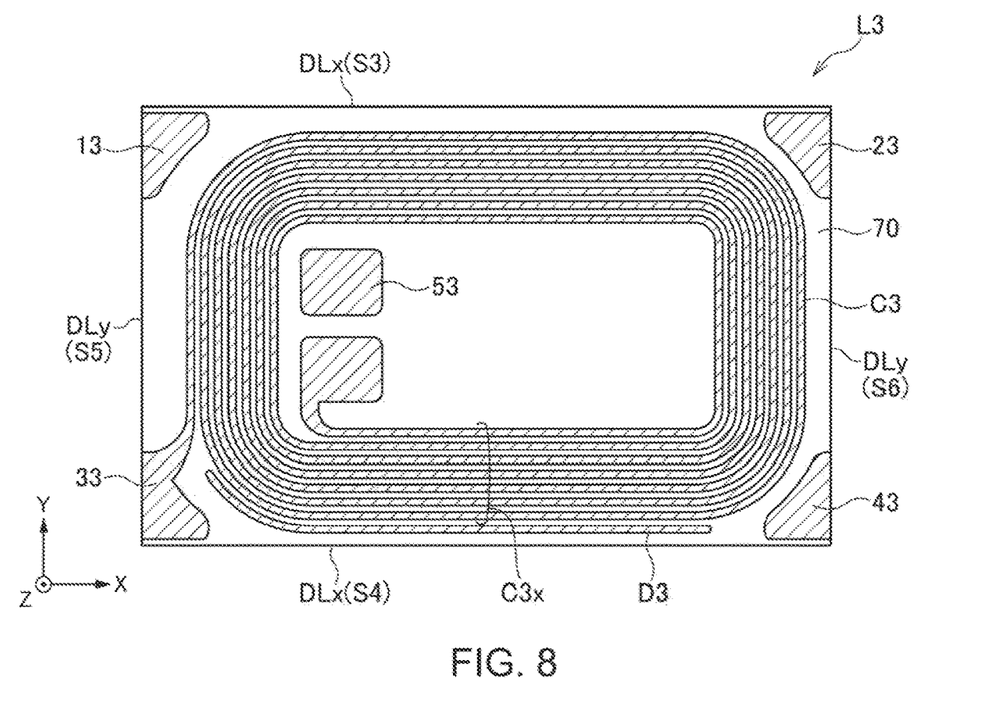
FIG. 8 is a schematic plan view for explaining the pattern shape of a conductor layer L3.

The conductor layer L3 illustrated in FIG. 8 is formed on the surface of the insulating layer 70. The conductor layer L3 has a spirally wound coil pattern C3, connection patterns 13, 23, 33, and 43, a relay pattern 53, and a dummy pattern D3. The outer peripheral end of the coil pattern C3 is connected to the connection pattern 33. The other connection patterns 13, 23, and 43, relay pattern 53, and dummy pattern D3 are not connected to the coil pattern C3 and are independent conductor patterns within the plane. The connection patterns 13, 23, 33, and 43 are connected respectively to the connection patterns 12, 22, 32, and 42 of the conductor layer L2 through the respective openings 71 to 74 formed in the insulating layer 70.

The inner peripheral end of the coil pattern C3 is connected to the relay pattern 52 through the opening 75. As a result, the inner peripheral end of the coil pattern C3 and the inner peripheral end of the coil pattern C1 are connected to each other through the relay pattern 52. The relay pattern 53 is connected to the inner peripheral end of the coil pattern C2 through the opening 76 formed in the insulating layer 70.

Figure 9:
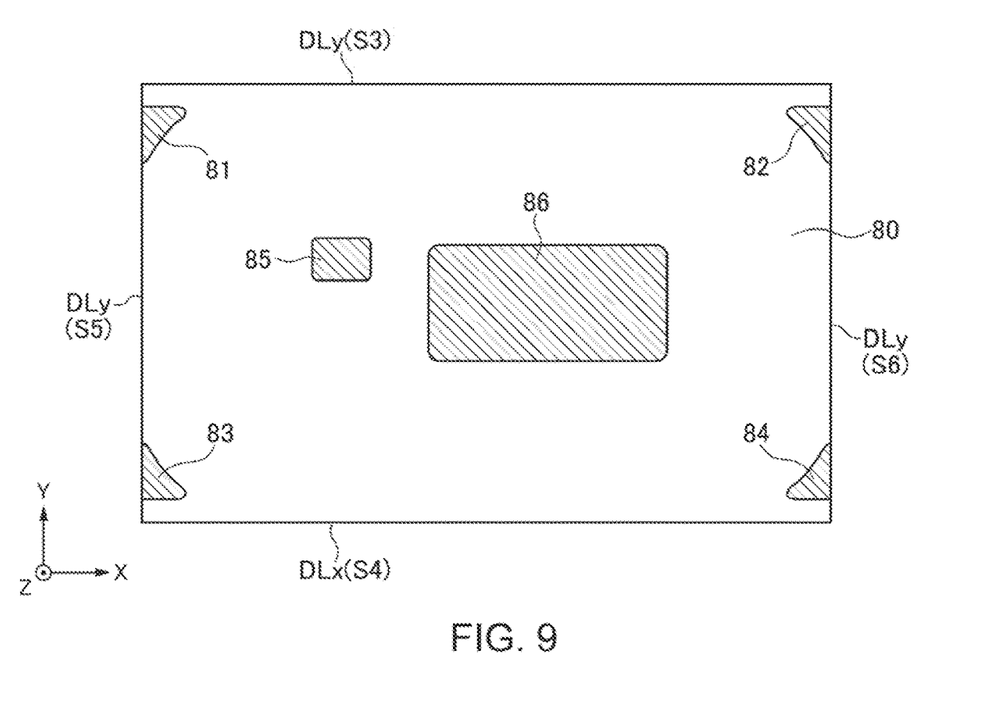
FIG. 9 is a schematic plan view for explaining the pattern shape of a insulating layer 80.

The conductor layer L3 is covered with the insulating layer 80 illustrated in FIG. 9. The insulating layer 80 has openings 81 to 86. The openings 81 to 84 are formed at positions overlapping the connection patterns 13, 23, 33, and 43, respectively. The opening 85 is formed at a position overlapping the relay pattern 53. The opening 86 is formed at a position overlapping the openings 77 and 66.

Figure 10:
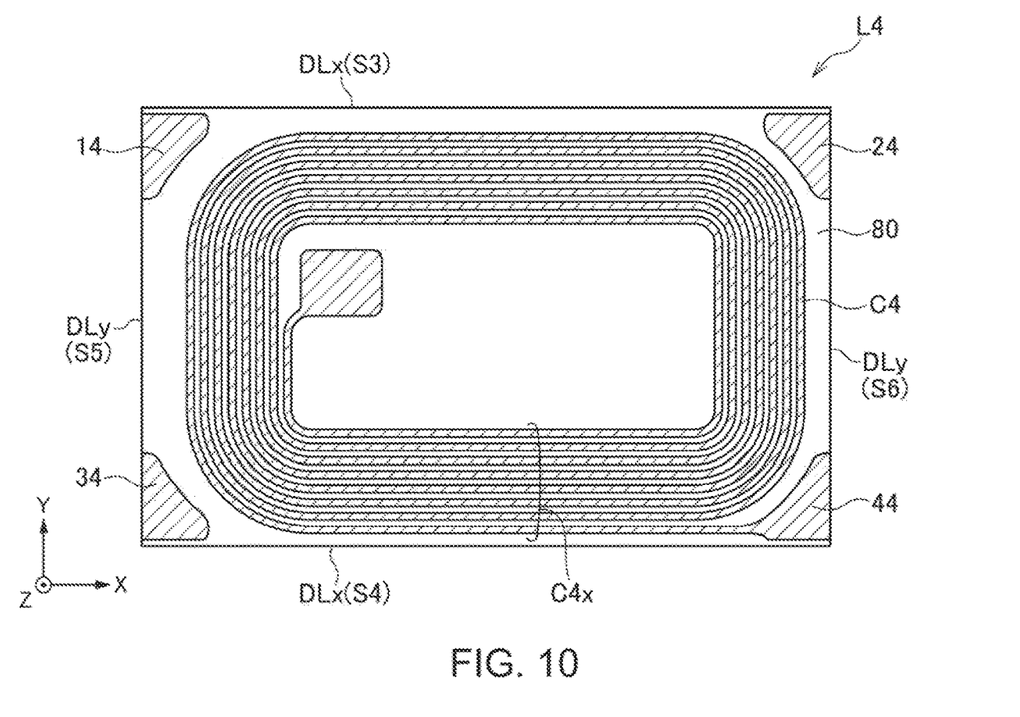
FIG. 10 is a schematic plan view for explaining the pattern shape of a conductor layer L4.

The conductor layer L4 illustrated in FIG. 10 is formed on the surface of the insulating layer 80. The conductor layer L4 has a spirally-wound coil pattern C4 and connection patterns 14, 24, 34, and 44. The outer peripheral end of the coil pattern C4 is connected to the connection pattern 44. The other connection patterns 14, 24, and 34 are not connected to the coil pattern C4 and are independent conductor patterns within the plane. The connection patterns 14, 24, 34, and 44 are connected respectively to the connection patterns 13, 23, 33, and 43 of the conductor layer L3 through the respective openings 81 to 84 formed in the insulating layer 80. The inner peripheral end of the coil pattern C4 is connected to the relay pattern 53 through the opening 85. As a result, the inner peripheral end of the coil pattern C4 and the inner peripheral end of the coil pattern C2 are connected to each other through the relay pattern 53. The number of lines of the coil pattern C4 in a section C4x extending in the X-direction is eight, while the number of lines of the coil pattern C3 in a section C3x extending in the X-direction is seven, which may cause a level difference at the outermost turn in the section C4x. However, in the present embodiment, the dummy pattern D3 is disposed at a position overlapping the outermost turn in the section C4x, which makes such a level difference unlikely to occur.

Figure 11:
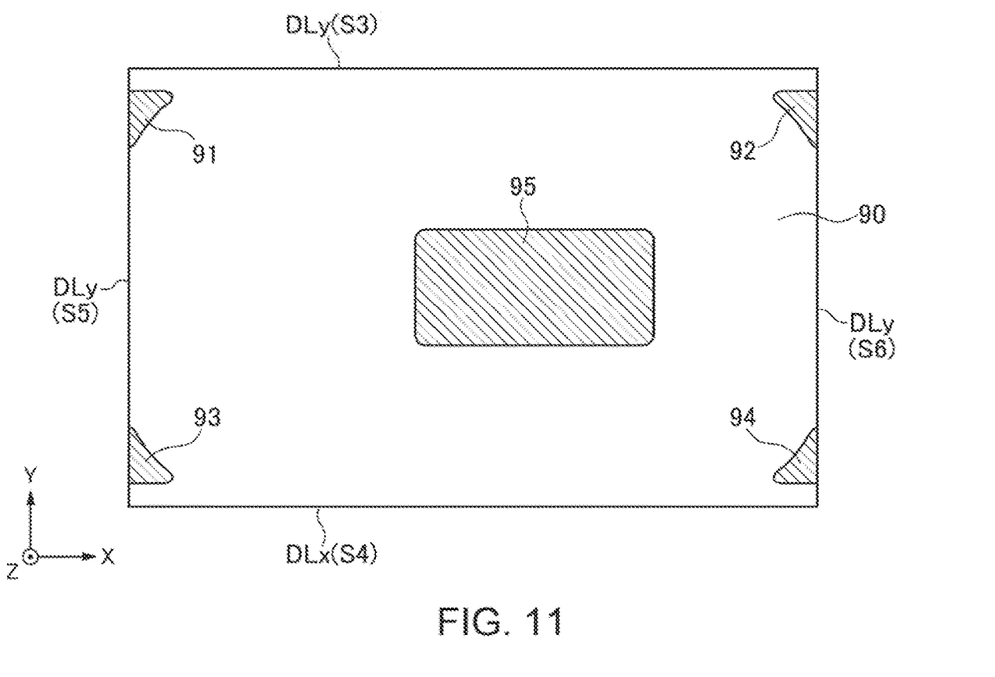
FIG. 11 is a schematic plan view for explaining the pattern shape of a insulating layer 90.

The conductor layer L4 is covered with the insulating layer 90 illustrated in FIG. 11. The insulating layer 90 has openings 91 to 95. The openings 91 to 94 are formed at positions overlapping the connection patterns 14, 24, 34, and 44, respectively. The opening 95 is formed at a position overlapping the openings 86, 77, and 66.

Figure 12:
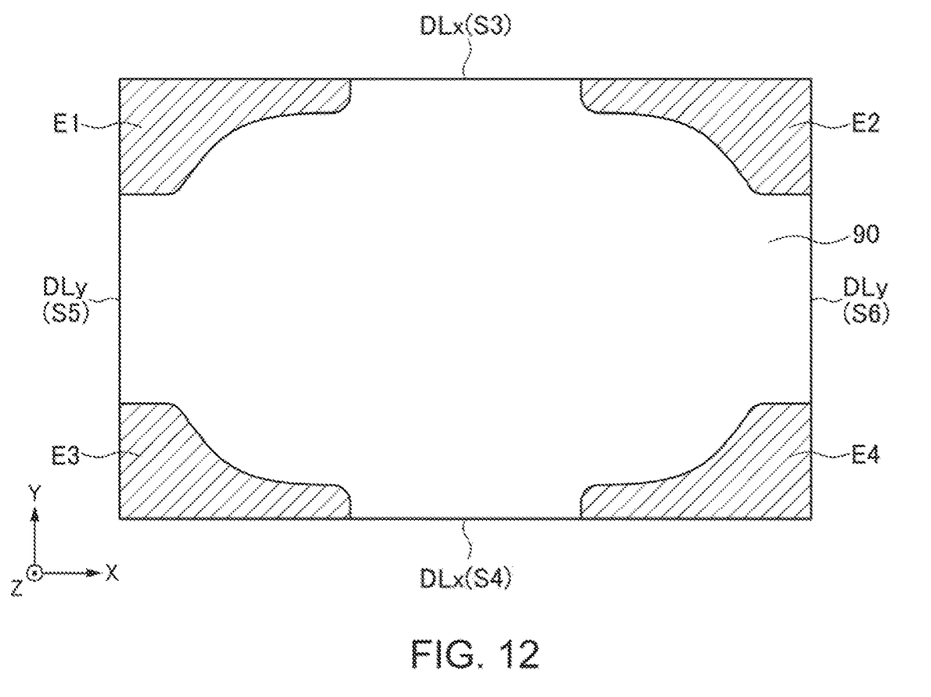
FIG. 12 is a schematic plan view for explaining the pattern shapes of the terminal electrodes E1 to E4.

The terminal electrodes E1 to E4 illustrated in FIG. 12 are formed on the surface of the insulating layer 90. The terminal electrodes E1 to E4 each include a bump conductor embedded in the magnetic material layer 5, and the surface of the bump conductor exposed to the mounting surface S1 constitutes each of the terminal electrodes E1 to E4. The surface of the bump conductor exposed to the mounting surface S1 may be subjected to surface treatment so as to improve solder wettability. The bottom portions of the bump conductors constituting the terminal electrodes E1 to E4 are connected respectively to the connection patterns 14, 24, 34, and 44 included in the conductor layer L4 through the respective openings 91 to 94. As a result, the coil patterns C1 and C3 are connected in series between the terminal electrodes E1 and E3, and the coil patterns C2 and C4 are connected in series between the terminal electrodes E2 and E4. Since the coil patterns C1 to C4 are stacked in this order in the Z-direction, high magnetic coupling is achieved between an inductor composed of the coil patterns C1 and C3 and an inductor composed of the coil patterns C2 and C4.

The magnetic material layer 5 illustrated in FIG. 1 is formed on the surface of the insulating layer 90 at a portion where the terminal electrodes E1 to E4 are absent. A part 5A (see FIG. 2) of the magnetic material layer 5 is embedded in the openings 95, 86, 77, and 66 and thereby functions as a magnetic path in the inner diameter areas of the coil patterns C1 to C4.

In actual manufacture, a plurality of the coil components 1 are taken from an aggregate substrate. At this time, the aggregate substrate is cut in the X- and Y-directions along the dicing lines DLx and DLy illustrated in FIGS. 4 to 12 for singulation.

Although the dicing position is adequately controlled by referring to a not-shown alignment mark, some misalignment inevitably occurs due to manufacturing error. When the position of the dicing line DLx in the Y-direction is significantly shifted, the coil patterns C1 to C4 may be exposed from the side surface S3 or S4 of the element body 2. However, in the present embodiment, the dummy patterns D1 and D2 have the protruding parts D1a and D2a, respectively, so that, before the coil patterns C1 to C4 are exposed from the side surface S3 or S4 of the element body 2 due to positional shift of the dicing line DLx in the Y-direction, it is possible to detect the positional shift of the dicing line DLx in the Y-direction by exposure of the protruding part D1a or D2a. Thus, when the protruding part D1a or D2a is exposed, the position of the dicing line DLx in the Y-direction is adjusted again for the subsequent production lots, making it possible to prevent the coil patterns C1 to C4 from being exposed from the side surface S3 or S4. The dummy patterns D1 and D2 are independent conductor patterns and are put in an electrically floating state, so that exposition thereof does not impair the characteristics of a product.

Figure 13:
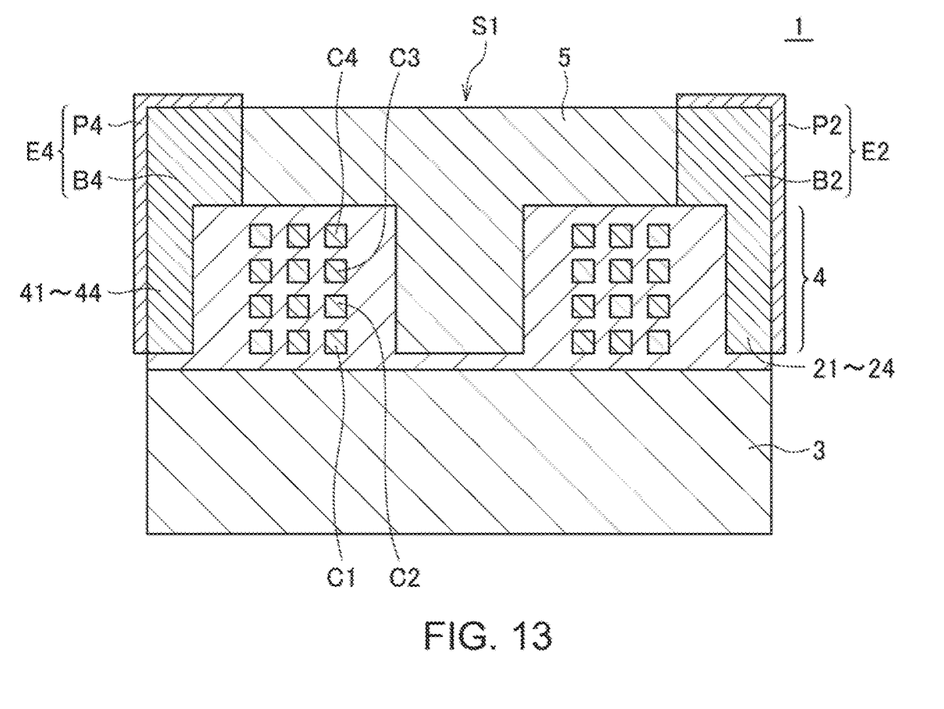
FIG. 13 is a schematic cross-sectional view of the coil component 1.

FIG. 13 is a schematic cross-sectional view of the coil component 1 according to the present embodiment.

In the example illustrated in FIG. 13, the terminal electrode E2 includes a bump conductor B2 and a surface-treated layer P2 covering the surface of the bump conductor B2, and the terminal electrode E4 includes a bump conductor B4 and a surface-treated layer P4 covering the surface of the bump conductor B4. The bump conductors B2 and B4 have the same planar shape as that of the surface-treated layers P2 and P4 on the mounting surface S1. That is, the bump conductors B2 and B4 each have a cutout part similar to the cutout part A illustrated in FIG. 2 so as to avoid overlapping with the coil patterns C1 to C4 in a plan view. Thus, as illustrated in FIG. 13, the bump conductors B2 and do not overlap the coil patterns C1 to C4 in a plan view (as viewed in the coil axis direction). The same applies to the other terminal electrodes E1 and E3, although not illustrated.

This can reduce the stray capacitance of the coil patterns C1 to C4 and increase the volume of the composite magnetic material constituting the magnetic material layer 5.

Figure 14:
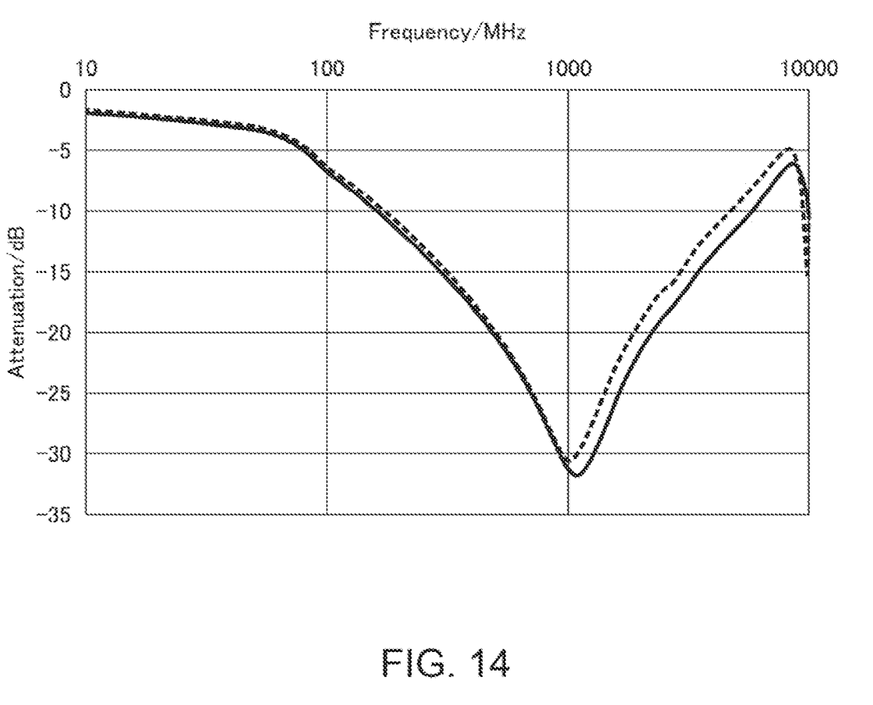
FIG. 14 is a graph illustrating attenuation characteristics (Scc21) of a common mode signal, in which the solid curve denotes the characteristics of the coil component 1 according to the present embodiment, and the dashed curve denotes the characteristics of a coil component according to a comparative example.

FIG. 14 is a graph illustrating attenuation characteristics (Scc21) of a common mode signal, in which the solid curve denotes the characteristics of the coil component 1 according to the present embodiment, and the dashed curve denotes the characteristics of a coil component according to a comparative example. In the coil component of the comparative example, the terminal electrodes E1 to E4 have a planar shape of a rectangle and overlap the coil patterns C1 to C4. Further, in the coil component of the comparative example, the terminal electrodes E1 to E4 have a width of W11 in the X-direction and a width of W12 in the Y-direction.

As can be seen from the graph of FIG. 14, the coil component 1 according to the present embodiment is higher in resonance frequency than the coil component of the comparative example and is larger in attenuation in a frequency band higher than or equal to the resonance frequency. This is because the capacitance component of the coil patterns C1 to C4 of the coil component 1 according to the present embodiment is reduced as compared with the coil component of the comparative example. The influence that the capacitance component of the coil patterns C1 to C4 has on the attenuation characteristics (Scc21) of a common mode signal becomes conspicuous with reduced distance between the coil patterns C1 to C4 and the terminal electrodes E1 to E4; however, in the present embodiment, the capacitance component generated between the terminal electrodes E1 to E4 and the coil patterns C1 to C4 is reduced, satisfactory attenuation characteristics can be achieved. In addition, the volume of the composite magnetic material constituting the magnetic material layer 5 is larger in the coil component 1 according to the present embodiment than in the coil component of the comparative example. Thus, in the coil component 1 according to the present embodiment, an inductance component increases with the result that the attenuation in a frequency band lower than the resonance frequency is also improved.

Figure 15:
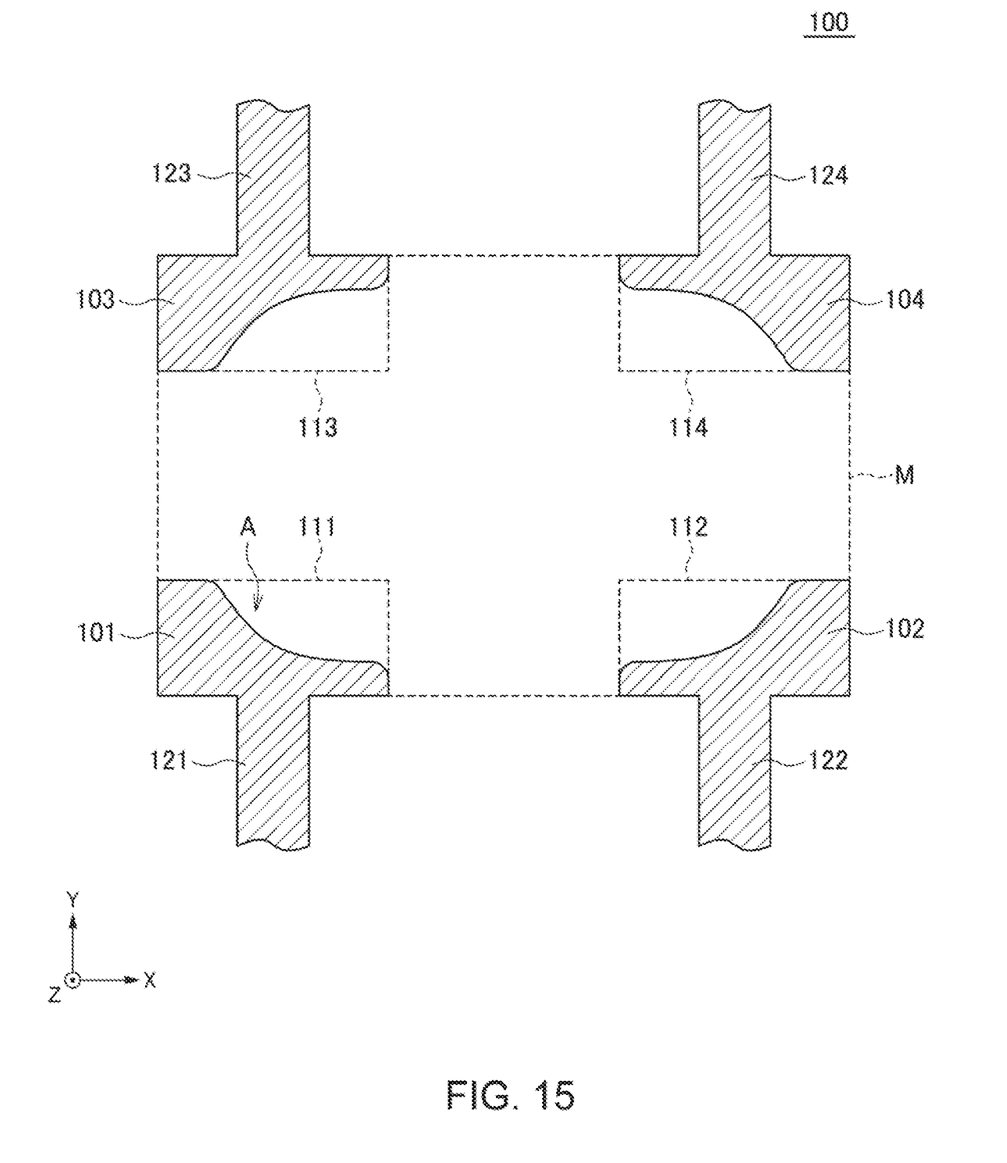
FIG. 15 is a schematic plan view illustrating the configuration of the main part of a substrate 100 on which the coil component 1 is mounted.

FIG. 15 is a schematic plan view illustrating the configuration of the main part of a substrate 100 on which the coil component 1 according to the present embodiment is mounted.

The substrate 100 illustrated in FIG. 15 has a mounting area M in which the coil component 1 is mounted, land patterns 101 to 104 formed in the mounting area M, and signal lines 121 to 124 connected respectively to the land patterns 101 to 104. For example, the signal lines 121 and 122 constitute a pair of input-side differential signal lines, and the signal lines 123 and 124 constitute a pair of output-side differential signal lines. In a state where the coil component 1 is mounted in the mounting area M, the terminal electrodes E1 to E4 of the coil component 1 are connected respectively to the land patterns 101 to 104 through a solder.

In the example illustrated in FIG. 15, the land patterns 101 to 104 have the same planar shapes as those of the terminal electrodes E1 to E4, respectively. That is, the land patterns 101 to 104 do not have a simple rectangular shape but have the cutout part A so as to avoid overlapping with the respective coil patterns C1 to C4 in a plan view. Thus, even after the coil component 1 is mounted in the mounting area M, the stray capacitance of the coil patterns C1 to C4 does not substantially increase. However, as denoted by the dashed lines in FIG. 15, rectangular land patterns 111 to 114 may be used. In this case, the land patterns 111 to 114 overlap the coil patterns C1 to C4, respectively, in a plan view, so that the stray capacitance of the coil patterns C1 to C4 increases after mounting; however, the coil patterns C1 to C4 and land patterns 111 to 114 are separated respectively by at least a distance corresponding to the thickness of the magnetic material layer 5, so that the increase in the stray capacitance is small.

Figure 16:
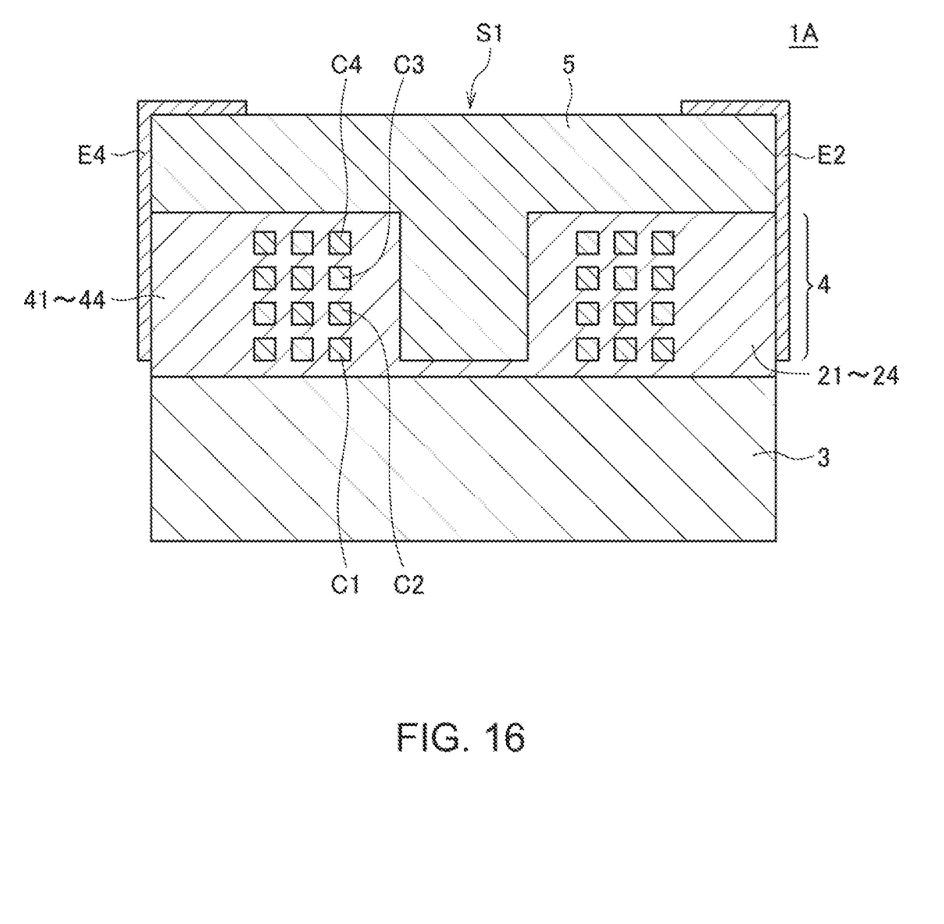
FIG. 16 is a schematic cross-sectional view of a coil component 1A according to a first modification.

FIG. 16 is a schematic cross-sectional view of a coil component 1A according to a first modification.

The coil component 1A according to the first modification illustrated in FIG. 16 differs from the coil component 1 according to the above embodiment in that each of the terminal electrodes E1 to E4 does not include the bump conductor but is made of a metal film that covers the surface of the magnetic material layer 5. Even in such a configuration, it is possible to reduce the stray capacitance of the coil patterns C1 to C4 by forming the planar shape of the terminal electrodes E1 to E4 on the mounting surface S1 into the shape illustrated in FIG. 2. As exemplified by the first modification, the coil component according to the present invention need not necessarily include the bump electrode. However, the bump conductor is disposed close to the coil pattern, so that the effect of the present invention is more conspicuous in a coil component having the bump conductor.

Figure 17:
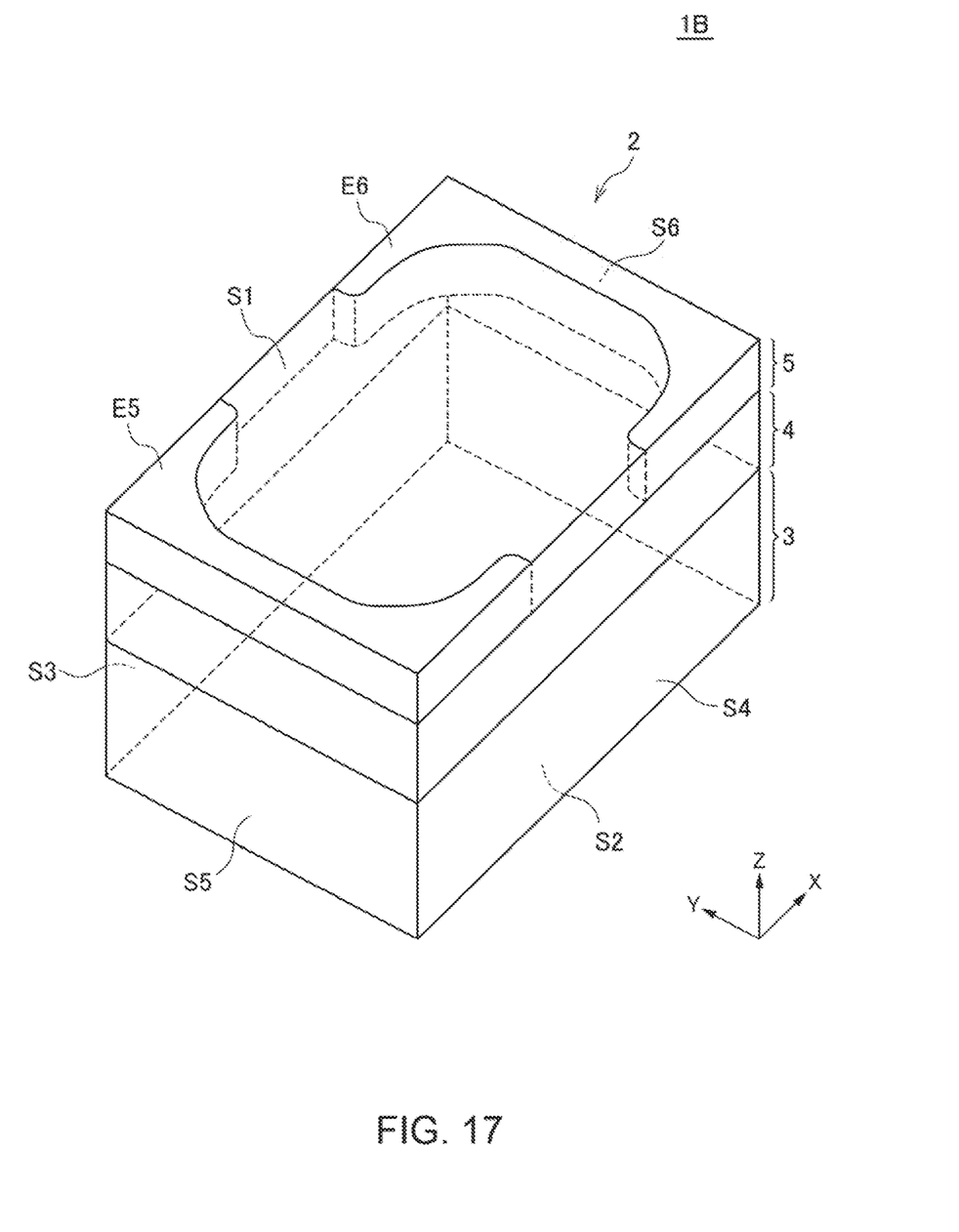
FIG. 17 is a schematic transparent perspective view of a coil component 1B according to a second modification.

FIG. 17 is a schematic transparent perspective view of a coil component 1B according to a second modification.

The coil component 1B according to the second modification illustrated in FIG. 17 differs from the coil component 1 according to the above embodiment in that it is a two-terminal type coil component including two terminal electrodes E5 and E6. Even in such a configuration, it is possible to reduce the stray capacitance of the coil pattern by forming the shape of the terminal electrodes E5 and E6 into a shape not overlapping the coil pattern. As exemplified by the second modification, the coil component according to the present invention need not necessarily be a common mode filter, but may be various coil components such as a simple coil, a pulse transformer, a balun transformer, and an LC composite component.

While the preferred embodiment of the present disclosure has been described, the present disclosure is not limited to the above embodiment, and various modifications may be made within the scope of the present disclosure, and all such modifications are included in the present disclosure.

The technology according to the present disclosure includes the following configuration examples but not limited thereto.

A coil component according to one aspect of the present disclosure includes: an element body having a mounting surface; a coil pattern embedded in the element body and having a coil axis extending perpendicular to the mounting surface; and a terminal electrode connected to the coil pattern and exposed to the mounting surface. The terminal electrode has a cutout part so as to avoid overlapping with the coil pattern in a plan view along the coil axis. With this configuration, it is possible to reduce the stray capacitance of the coil pattern while ensuring a sufficient exposed area of the terminal electrode on the mounting surface.

In the above coil component, an edge constituting the cutout part may extend along the outermost turn of the coil pattern in a plan view. Thus, it is possible to enlarge the exposed area of the terminal electrode on the mounting surface while avoiding overlap between the terminal electrode and the coil pattern.

In the above coil component, the element body may include a coil layer in which a plurality of insulating layers and a plurality of conductor layers each constituting the coil pattern are alternately stacked and a magnetic material layer covering the coil layer and constituting the mounting surface. Thus, a high inductance can be achieved.

In the above coil component, the terminal electrode may include a bump conductor embedded in the magnetic material layer, and the bump conductor may have a cutout part so as to avoid overlapping with the coil pattern in a plan view. This makes it possible to prevent an increase in stray capacitance due to overlap between the bump conductor and the coil pattern.

In the above coil component, the coil pattern may include first and second coil patterns magnetically coupled to each other, the terminal electrode may include a first terminal electrode connected to one end of the first coil pattern, a second terminal electrode connected to one end of the second coil pattern, a third terminal electrode connected to the other end of the first coil pattern, and a fourth terminal electrode connected to the other end of the second coil pattern, the mounting surface may have first to fourth corner parts, and the first to fourth terminal electrodes may be disposed at the first to fourth corner parts, respectively. This makes it possible to provide a common mode filter excellent in high-frequency characteristics.

A circuit board according to one aspect of the present disclosure includes the above-described coil component and a substrate on which the coil component is mounted. The substrate may have a land pattern connected to the terminal electrode, and the land pattern may have a cutout part so as to avoid overlapping with the coil pattern in a plan view. Thus, even after the coil component is mounted on the substrate, an increase in the stray capacitance of the coil pattern can be prevented.

What is claimed is:

1. A coil component comprising:
    an element body having a mounting surface;
    a coil pattern embedded in the element body and having a coil axis extending perpendicular to the mounting surface; and
    a terminal electrode connected to the coil pattern and exposed to the mounting surface,
    wherein the terminal electrode has a cutout part so as to avoid overlapping with the coil pattern in a plan view along the coil axis,
    wherein the element body includes:
        a coil layer in which a plurality of insulating layers and a plurality of conductor layers each constituting the coil pattern are alternately stacked; and
        a magnetic material layer covering the coil layer and constituting the mounting surface,
    wherein the terminal electrode includes a bump conductor embedded in the magnetic material layer, and
    wherein the bump conductor has a cutout part so as to avoid overlapping with the coil pattern in a plan view.

2. The coil component as claimed in claim 1, wherein an edge of the terminal electrode constituting the cutout part extends along an outermost turn of the coil pattern in a plan view.

3. The coil component as claimed in claim 1,
    wherein the coil pattern includes first and second coil patterns magnetically coupled to each other,
    wherein the terminal electrode includes:
        a first terminal electrode connected to one end of the first coil pattern;
        a second terminal electrode connected to one end of the second coil pattern;
        a third terminal electrode connected to another end of the first coil pattern; and
        a fourth terminal electrode connected to another end of the second coil pattern,
    wherein the mounting surface has first to fourth corner parts, and
    wherein the first to fourth terminal electrodes are disposed at the first to fourth corner parts, respectively.

4. A circuit board comprising:
    a coil component; and
    a substrate on which the coil component is mounted,
    wherein the coil component comprises:
        an element body having a mounting surface;
        a coil pattern embedded in the element body and having a coil axis extending perpendicular to the mounting surface; and
        a terminal electrode connected to the coil pattern and exposed to the mounting surface,
    wherein the terminal electrode has a cutout part so as to avoid overlapping with the coil pattern in a plan view along the coil axis,
    wherein the substrate has a land pattern connected to the terminal electrode, and
    wherein the land pattern has a cutout part so as to avoid overlapping with the coil pattern in a plan view
    wherein the element body includes:
        a coil layer in which a plurality of insulating layers and a plurality of conductor layers each constituting the coil pattern are alternately stacked; and
        a magnetic material layer covering the coil layer and constituting the mounting surface,
    wherein the terminal electrode includes a bump conductor embedded in the magnetic material layer, and
    wherein the bump conductor has a cutout part so as to avoid overlapping with the coil pattern in a plan view.

* * * * *